(12) United States Patent
Vilhonen

(10) Patent No.: US 8,542,769 B2
(45) Date of Patent: Sep. 24, 2013

(54) HIGH OUTPUT POWER DIGITAL TX

(75) Inventor: Sami Vilhonen, Lieto (FI)

(73) Assignee: ST-Ericsson SA, Plan-les-Ouates (CH)

(*) Notice: Subject to any disclaimer, the term of this patent is extended or adjusted under 35 U.S.C. 154(b) by 277 days.

(21) Appl. No.: 13/156,751

(22) Filed: Jun. 9, 2011

(65) Prior Publication Data

US 2012/0314795 A1 Dec. 13, 2012

(51) Int. Cl.
- *H04K 1/02* (2006.01)
- *H04L 25/03* (2006.01)
- *H04L 25/49* (2006.01)

(52) U.S. Cl.
USPC ............ 375/297; 375/261; 375/296; 341/144

(58) Field of Classification Search
USPC ......... 375/295–298, 285, 259–261; 341/126, 341/144, 153; 330/252, 247–248
See application file for complete search history.

(56) References Cited

U.S. PATENT DOCUMENTS

| | | | |
|---|---|---|---|
| 5,847,669 A | 12/1998 | Kochi | |
| 5,856,799 A | 1/1999 | Hamasaki et al. | |
| 6,278,731 B1 | 8/2001 | Galperin | |
| 6,487,398 B1 * | 11/2002 | Nobbe et al. | 455/118 |
| 6,501,409 B1 | 12/2002 | Lynn et al. | |
| 6,690,313 B1 | 2/2004 | Warren et al. | |
| 6,937,848 B2 | 8/2005 | Eloranta et al. | |
| 7,061,418 B2 | 6/2006 | Zebedee | |
| 7,123,072 B2 | 10/2006 | Bu et al. | |
| 7,136,058 B2 | 11/2006 | Nakamura et al. | |
| 7,418,056 B2 | 8/2008 | Suzuki et al. | |
| 7,558,538 B2 * | 7/2009 | Carrez | 455/112 |
| 7,583,754 B2 | 9/2009 | Liu | |
| 7,830,982 B2 | 11/2010 | Mesecher | |
| 7,853,293 B2 | 12/2010 | Doi | |
| 7,902,937 B2 * | 3/2011 | Mu | 332/103 |
| 7,907,671 B2 | 3/2011 | Klomsdorf et al. | |
| 8,063,806 B2 * | 11/2011 | Koli | 341/143 |
| 8,098,726 B2 * | 1/2012 | Lakdawala et al. | 375/238 |

(Continued)

FOREIGN PATENT DOCUMENTS

EP 2204910 A1 7/2010

OTHER PUBLICATIONS

Yoo, S-M, et al., "A Switched-Capacitor Power Amplifier for EER/Polar Transmitters", 2011 IEEE International Solid-State Circuits Conference Digest of Technical Papers (ISSCC), Feb. 20, 2011, pp. 428-430, IEEE, San Francisco, CA, US.

(Continued)

*Primary Examiner* — Jean B Corrielus
(74) *Attorney, Agent, or Firm* — Coats & Bennett, P.L.L.C.

(57) ABSTRACT

The disclosed apparatus and corresponding method uses amplifiers and a differential combiner to control the output power of a digital-to-analog upconverter and to isolate In-phase and Quadrature branches of the upconverter. First and second upconverters convert In-phase and Quadrature portions of a baseband digital value to respective first/second In-phase ($I_p/I_n$) and first/second Quadrature ($Q_p/Q_n$) analog components at RF. First and second amplifiers respectively amplify $I_p$, $I_n$ and $Q_p$, $Q_n$ to respectively generate amplified $I_p$, $I_n$ and $Q_p$, $Q_n$ signals. The first and second amplifiers each operate at a 50% duty cycle and in an interleaved fashion such that only one amplifier is active to generate an output at any time, and such that the amplified signals are output in an interleaved fashion. A differential combiner combines the amplified signals to generate the RF analog signal representative of the baseband digital value.

20 Claims, 9 Drawing Sheets

(56) References Cited

U.S. PATENT DOCUMENTS

| | | | |
|---|---|---|---|
| 8,428,544 B2* | 4/2013 | Heck et al. | 455/323 |
| 2007/0146186 A1 | 6/2007 | Jungerman | |
| 2008/0285676 A1 | 11/2008 | Goussin et al. | |
| 2011/0007840 A1* | 1/2011 | Hirai | 375/296 |

OTHER PUBLICATIONS

Borremans, J., et al., "A 40nm CMOS Highly Linear 0.4-to-6GHz Receiver Resilient to 0dBm Out-of-Band Blockers", 2011 IEEE International Solid-State Circuits Conference Digest of Technical Papers (ISSCC), Feb. 20, 2011, pp. 62-64, IEEE, San Francisco, CA, US.

Nguyen, H.-N., et al., "P-58: A Differential Multi-bit/Conversion Cyclic DAC for TFT-LCD Column Drivers", SID Symposium Digest of Technical Papers, May 1, 2010, pp. 1458-1461, vol. 41, Issue 1, Korea Advanced Institute of Science and Technology, Daejeon, Korea, [retrieved on May 29, 2013], retrieved online: http://nice.kaist.ac.kr/pdf/conferences/2010/1.pdf.

* cited by examiner

HIGH OUTPUT POWER DIGITAL TX

The invention disclosed herein generally relates to wireless transmitters, and more particularly relates to high output power digital transmitters.

BACKGROUND

Digital-to-analog converters may be used for a wide variety of applications, including wireless transmitters. Conventional wireless transmitters may first pass a digital signal through a digital-to-analog converter to convert the digital signal to an analog signal, and then pass the analog signal through filters, mixers, and amplification stages to generate a transmission signal at a desired radio frequency (RF). Recently, direct digital-to-RF converters have simplified wireless transmitters by combining digital-to-analog conversion with RF upconversion. Such direct digital-to-RF converters have significant advantages, e.g., fewer components, improved accuracy, smaller footprint, etc. When used in high power applications, however, direct digital-to-RF converters may have a high current consumption. Because current draw from the power supply converts to supply power voltage based on the corresponding resistance, and because the direct digital-to-RF converter transforms variations in the power supply to noise, the high current consumption and the corresponding resistance limits the maximum output power available with a direct digital-to-RF converter. Further, when the direct digital-to-RF converter has an IQ modulation structure, the In-phase (I) and Quadrature (Q) branches act as loads for each other, which limits the maximum signal level achievable by the direct digital-to-RF converter. For example, the I and Q branches deliver an out-of-phase signal, which reduces the maximum output power relative to in phase operation. Thus, there remains a need for improved direct digital-to-RF converters for high power and/or IQ applications.

SUMMARY

The disclosed digital-to-analog upconverter addresses the above-described problems by connecting first and second amplifiers to first and second balanced upconverters, respectively, to control the output power. The digital-to-analog upconverter further connects the amplifier outputs to a differential combiner to isolate the first and second upconverters. The first balanced upconverter converts an In-phase portion of a baseband digital value to a first In-phase analog component ($I_p$) at a radio frequency (RF) and a second In-phase analog component ($I_n$) at the RF, where the $I_n$ is phase-shifted relative to $I_p$. The second balanced upconverter converts a Quadrature portion of the baseband digital value to a first Quadrature analog component ($Q_p$) at the RF and a second Quadrature analog component ($Q_n$) at the RF, where $Q_n$ is phase-shifted relative to $Q_p$. The first amplifier amplifies $I_p$ and $I_n$ to generate amplified $I_p$ and $I_n$ signals at first and second In-phase amplifier outputs, while the second amplifier amplifies $Q_p$ and $Q_n$ to generate amplified $Q_p$ and $Q_n$ signals at first and second Quadrature amplifier outputs. The first and second amplifiers each operate at a 50% duty cycle and in an interleaved fashion such that only one of the first and second amplifiers is active at any time, and such that the first amplifier outputs the amplified $I_p$ and amplified $I_n$ signals for a first 25% of the cycle, the second amplifier outputs the amplified $Q_p$ and amplified $Q_n$ signals for a subsequent second 25% of the cycle, the first amplifier outputs the amplified $I_p$ and amplified $I_n$ signals for a subsequent third 25% of the cycle, and the second amplifier outputs the amplified $Q_p$ and $Q_n$ signals for a final 25% of the cycle. The differential combiner combines the amplified signals output by the first and second amplifiers during the cycle to generate the RF analog signal representative of the baseband digital value.

The invention disclosed herein also includes a method of converting a sequence of baseband digital values to an RF analog signal. The method includes converting an In-phase portion of a baseband digital value to a first ($I_p$) and second ($I_n$) In-phase analog component at a radio frequency (RF), and converting a Quadrature portion of the baseband digital value to a first ($Q_p$) and second ($Q_n$) Quadrature analog component at the RF. The method further includes amplifying $I_p$ and $I_n$ using a first amplifier to generate amplified $I_p$ and $I_n$ signals at first and second In-phase amplifier outputs, and amplifying $Q_p$ and $Q_n$ using a second amplifier to generate amplified $Q_p$ and $Q_n$ signals at first and second Quadrature amplifier outputs, where the amplifier outputs the amplified signals relative to the duty cycle as disclosed above. The amplified signals are combined to generate the RF analog signal representative of the baseband digital value.

DETAILED DESCRIPTION

Figure 1:
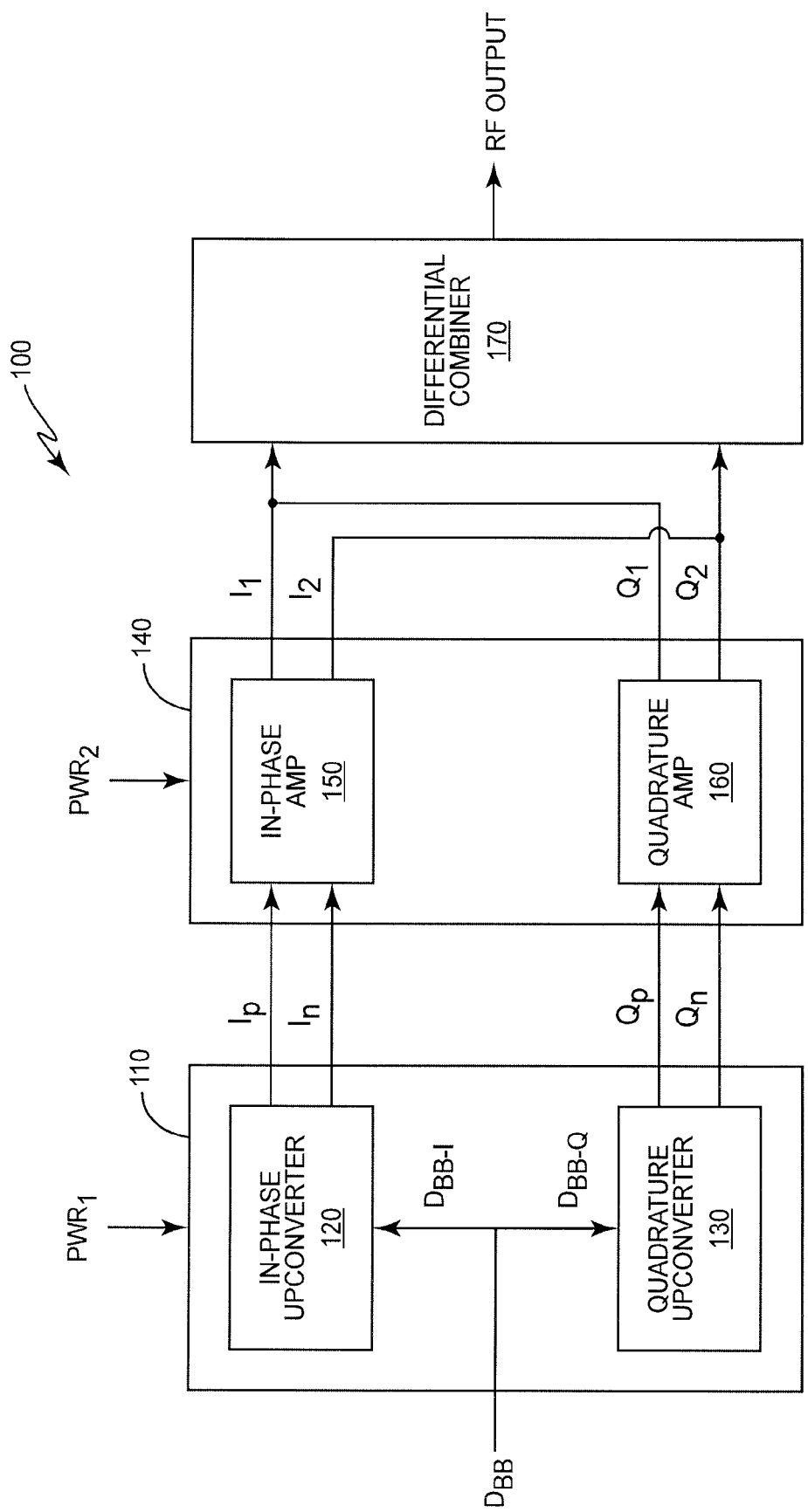
FIG. 1 depicts a block diagram of a digital-to-analog upconverter according to one exemplary embodiment.
Figure 2:
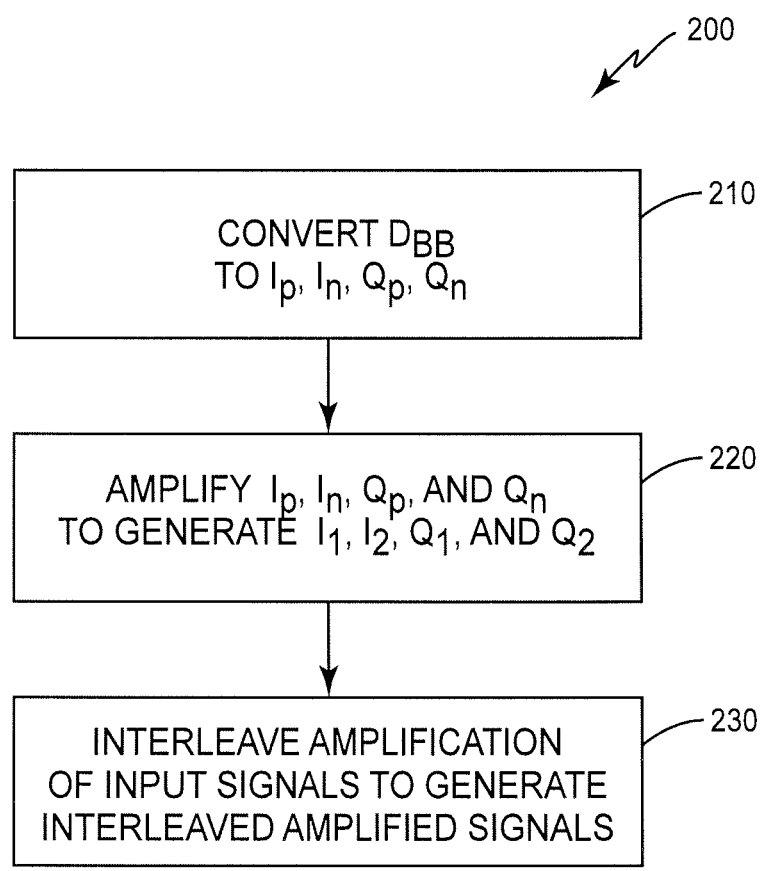
FIG. 2 depicts an exemplary method executed by the digital-to-analog upconverter of FIG. 1.

FIGS. 1 and 2 respectively depict a block diagram of an exemplary digital-to-analog upconverter 100 and the corresponding upconversion method 200. Digital-to-analog upconverter 100 comprises an upconversion module 110, an amplifier module 140, and a differential combiner 170. The upconversion module 110 upconverts a digital baseband value $D_{BB}$ to phase-shifted analog signals at a radio frequency (RF). The amplifier module 140 amplifies the upconverted analog signals to generate amplified analog signals. The differential combiner 170 combines the amplified analog signals to generate an RF analog signal representative of $D_{BB}$. A single power supply may be used to power the upconversion module 110 and the amplifier module 140. For some embodiments, however, it will be appreciated that the upconversion module 110 may be powered by a first power supply ($PWR_1$), while the amplifier module 140 may be powered by a separate second power supply ($PWR_2$).

Upconversion module 110 comprises an In-phase upconverter 120 and a Quadrature upconverter 130. In-phase upconverter 120 converts the In-phase portion of $D_{BB}$ ($D_{BB-I}$) to a first In-phase analog signal ($I_p$) and a second In-phase analog signal ($I_n$), both at the RF (block 210). $I_p$ and $I_n$ have the same magnitude but are phase-shifted, e.g., by 175°-185°, with respect to each other. Similarly, Quadrature upconverter 130 converts the Quadrature portion of $D_{BB}$ ($D_{BB-Q}$) to a first Quadrature analog signal ($Q_p$) and a second Quadrature analog signal ($Q_n$), both at the RF (block 210). $Q_p$ and $Q_n$ have the same magnitude but are phase-shifted, e.g., by 175°-185°, with respect to each other. As understood by those skilled in the art, $I_p$ and $I_n$ are out of phase from $Q_p$ and $Q_n$, e.g., by 90°.

Amplifier module 140 comprises an In-phase amplifier 150 and a Quadrature amplifier 160. In-phase amplifier 150 amplifies $I_n$ and $I_p$ to generate amplified In-phase signals $I_1$, $I_2$ (block 220). $I_1$ and $I_2$ have the same magnitude but are phase-shifted, e.g., by 175°-185°, with respect to each other. Quadrature amplifier 160 amplifies $Q_p$ and $Q_n$ to generate amplified Quadrature signals $Q_1$, $Q_2$ (block 220). $Q_1$ and $Q_2$ have the same magnitude but are phase-shifted, e.g., by 175°-185°, with respect to each other. As understood by those skilled in the art, $I_1$ and $I_2$ are out of phase from $Q_1$ and $Q_2$, e.g., by 90°. Differential combiner 170 combines $I_1$ and $I_2$, and $Q_1$ and $Q_2$ to generate an RF analog signal (RF Output) representative of $D_{BB}$.

Amplifiers 150, 160 alternately output the amplified analog signals to interleave the amplification of the input signals (block 230). More particularly, amplifiers 150, 160 are enabled with an enable signal operating at a 50% duty cycle relative to a time period and having a fundamental frequency that is twice the RF of the input analog signals, where the enable signal for the In-phase amplifier 150 is 180° out of phase with the enable signal for the Quadrature amplifier. As a result, only one amplifier 150, 160 is active during any particular portion of the time period, causing the amplifiers 150, 160 to output signals $I_1$, $I_2$, $Q_1$, and $Q_2$ in an interleaved fashion. For example, Table 1 shows the amplified signals at the different amplifier outputs during different quarters of the time period, where $\hat{I}_p$, $\hat{I}_n$, $\hat{Q}_p$, and $\hat{Q}_n$ respectively correspond to the amplified $I_p$, amplified $I_n$, amplified $Q_p$, and amplified $Q_n$ signals.

TABLE 1

| | 1$^{st}$ Quarter | 2$^{nd}$ Quarter | 3$^{rd}$ Quarter | 4$^{th}$ Quarter |
|---|---|---|---|---|
| $I_1$ | $\hat{I}_p$ | Off | $\hat{I}_p$ | Off |
| $I_2$ | $\hat{I}_n$ | Off | $\hat{I}_n$ | Off |
| $Q_1$ | Off | $\hat{Q}_p$ | Off | $\hat{Q}_p$ |
| $Q_2$ | Off | $\hat{Q}_n$ | Off | $\hat{Q}_n$ |

As shown by Table 1, both amplifiers 150, 160 are active for 50% of the time period, and therefore, have a 50% duty cycle. However, due to the frequency and phase differences of the amplifiers' input signals and the characteristics of the amplifiers' enable signals, the specific signals affecting each amplifier output, e.g., $D_{BB-I}$, $D_{BB-Q}$, $V_{bias}$, etc., are each available at the amplifier outputs for 25% of the time period, and therefore are unavailable for 75% of the time period. More particularly, because the amplifier input signals are at RF and the amplifier enable signals are at twice RF, because both amplifier input signals are amplified at the same time, and because the In-phase and Quadrature signals are out-of-phase, e.g., by 90°, each combination of amplifier output signals has a 25/75 duty cycle. Because $I_p$ and (and $Q_p$ and $Q_n$) are different during different quarters of time period, the amplified signals are also different during different quarters. For example, when $I_p$ is derived from $D_{BB-I}$ during the first quarter, it is derived from $V_{bias}$ during the third quarter. Similar logic applies to $I_n$ and the Quadrature signals. Table 2 shows the different amplifier outputs for this example.

TABLE 2

| | 1$^{st}$ Quarter | 2$^{nd}$ Quarter | 3$^{rd}$ Quarter | 4$^{th}$ Quarter |
|---|---|---|---|---|
| $I_1$ | $\hat{I}_p \propto D_{BB-I}$ | Off | $\hat{I}_p = V_{bias}$ | Off |
| $I_2$ | $\hat{I}_n = V_{bias}$ | Off | $\hat{I}_n \propto D_{BB-I}$ | Off |
| $Q_1$ | Off | $\hat{Q}_p \propto D_{BB-Q}$ | Off | $\hat{Q}_p = V_{bias}$ |
| $Q_2$ | Off | $\hat{Q}_n = V_{bias}$ | Off | $\hat{Q}_n \propto D_{BB-Q}$ |

As a result, $D_{BB-I}$ is present in $I_1$ 25% of the time, and is present in $I_2$ 25% of the time. Similarly, $D_{BB-Q}$ is present in $Q_1$ 25% of the time, and is present in $Q_2$ 25% of the time. Thus, the RF output of the differential combiner 170 is proportional to $D_{BB-I}-V_{bias}$ in the first quarter, proportional to $D_{BB-Q}-V_{bias}$ in the second quarter, proportional to $V_{bias}-D_{BB-I}$ in the third quarter, and proportional to $V_{bias}-D_{BB-Q}$ in the fourth quarter.

Figure 3:
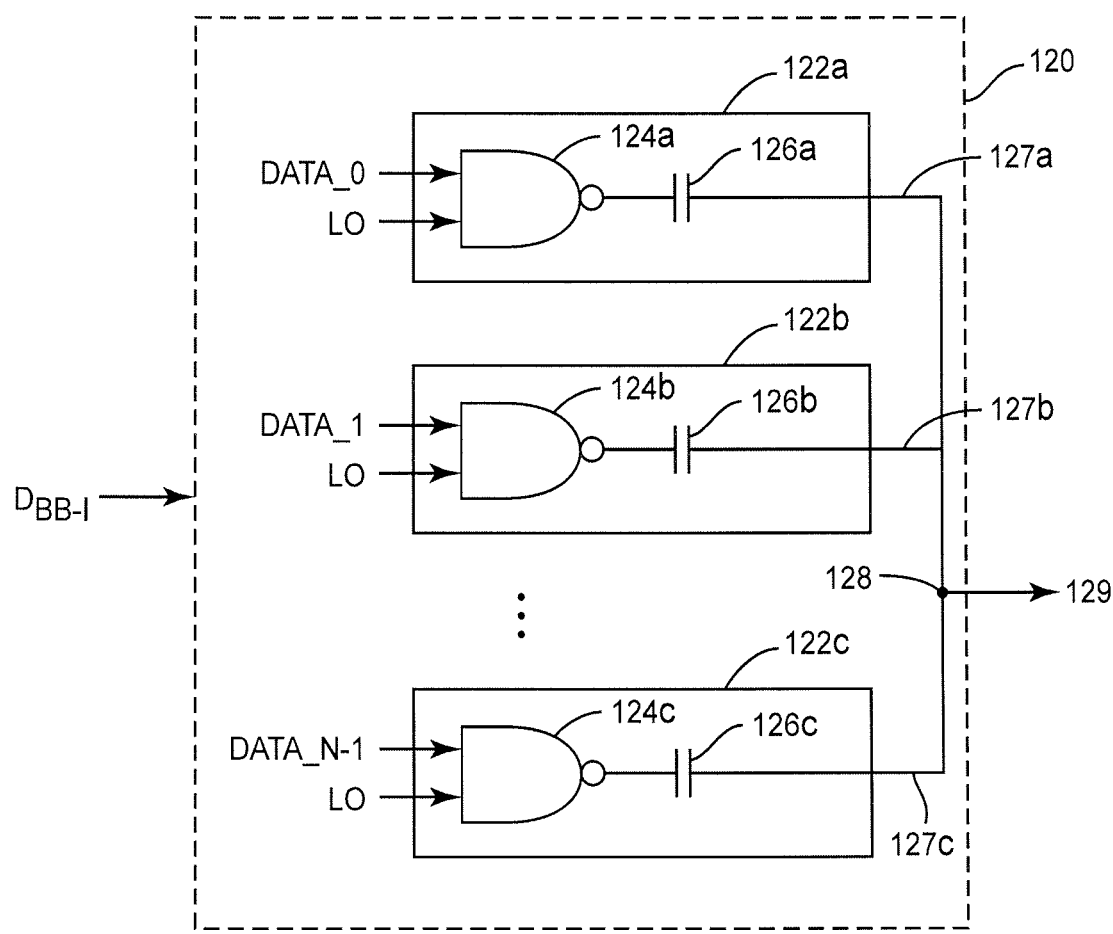
FIG. 3 depicts an exemplary upconversion module for the digital-to-analog upconverter of FIG. 1.

While the amplifiers 150, 160 disclosed herein may be used with any direct digital-to-analog upconverter, FIG. 3 depicts a block diagram of an exemplary In-phase upconverter 120 that upconverts an N-bit In-phase portion of the digital baseband value $D_{BB}$ ($D_{BB-I}$). For simplicity, the In-phase upconverter 120 of FIG. 3 only depicts one output, e.g., an In-phase output encompassing both $I_p$ and $I_n$. While details are only shown for In-phase upconverter 120, it will be appreciated that Quadrature upconverter 130 generally comprises the same circuits as the In-phase upconverter 120, where the Local Oscillator (LO) signals received by the Quadrature upconverter 130 are out of phase from the LO signals received by the In-phase upconverter 120, e.g., by 90°. Further details for exemplary upconversion modules may be found in U.S. patent application Ser. No. 13/076,717 filed 31 Mar. 2011, which is incorporated by reference herein.

As depicted in FIG. 3, In-phase upconverter 120 comprises a plurality of conversion units 122a-c coupled at the output to a common node 128. Each conversion unit 122 includes a logic unit 124 and a weighting unit 126. The logic units 124 modulate or null the input oscillator signal (LO) responsive to the corresponding input digital bit to generate an RF signal. This may be performed, for example, by multiplying LO with the input digital bit using a NAND, AND, OR, NOR, XOR, or XNOR logic gate, inverter, three-state inverter, transmission gate, series switches, or any other suitable means. When a logic gate is used, e.g., an OR, NOR, NAND, or AND gate, the result is a signal which is substantially constant when the input bit is in a first state (e.g., a high or low state), and is an oscillating signal at RF when the input bit is in a second state (e.g., a low or high state).

Weighting units 126 convert the signal output by the corresponding logic unit 124 to a weighted analog RF signal 127. The weighting applied by weighting units 126 depends on the weight of the respective input bits. For example, if $D_{BB-I}$ represents a binary number, each weighting unit 126 applies the binary weighting associated with the corresponding input bit within the binary number. Alternatively, if $D_{BB-I}$ represents a thermometer coded value, each weighting unit 126 applies equal weight. In this case, weighting units 126 may not be required, or may comprise units 126 with equal weights. The result is that the weighting units 126, e.g., capacitors 126, control the relative amplitudes of the upconverted signals output by the NAND gates 124 according to the binary weighting of the respective bits of the input digital value. In various embodiments, weighting units 126 may comprise capacitors, resistors, inductors or any other suitable means to control the relative amplitude of the individual upconverted signals output by the logic units 124.

The weighted analog RF signals 127 are combined at junction 128 to produce a combined In-phase RF analog signal 129, the amplitude of which is representative of $D_{BB-I}$. For example, the combined In-phase RF analog signal comprises a weighted sum, or other suitable combination, of the individual weighted analog signals 127. Each input data bit therefore contributes to the signal magnitude at the combining node 128 according to the bit value (e.g., 0 or 1), as well as according to the weight of the corresponding weighting unit 126, which in turn depends on the weight of the corresponding bit. The resulting RF analog signal 129 generated at the common adding point 128 therefore has a magnitude that is proportional to $D_{BB-I}$.

Figure 4:
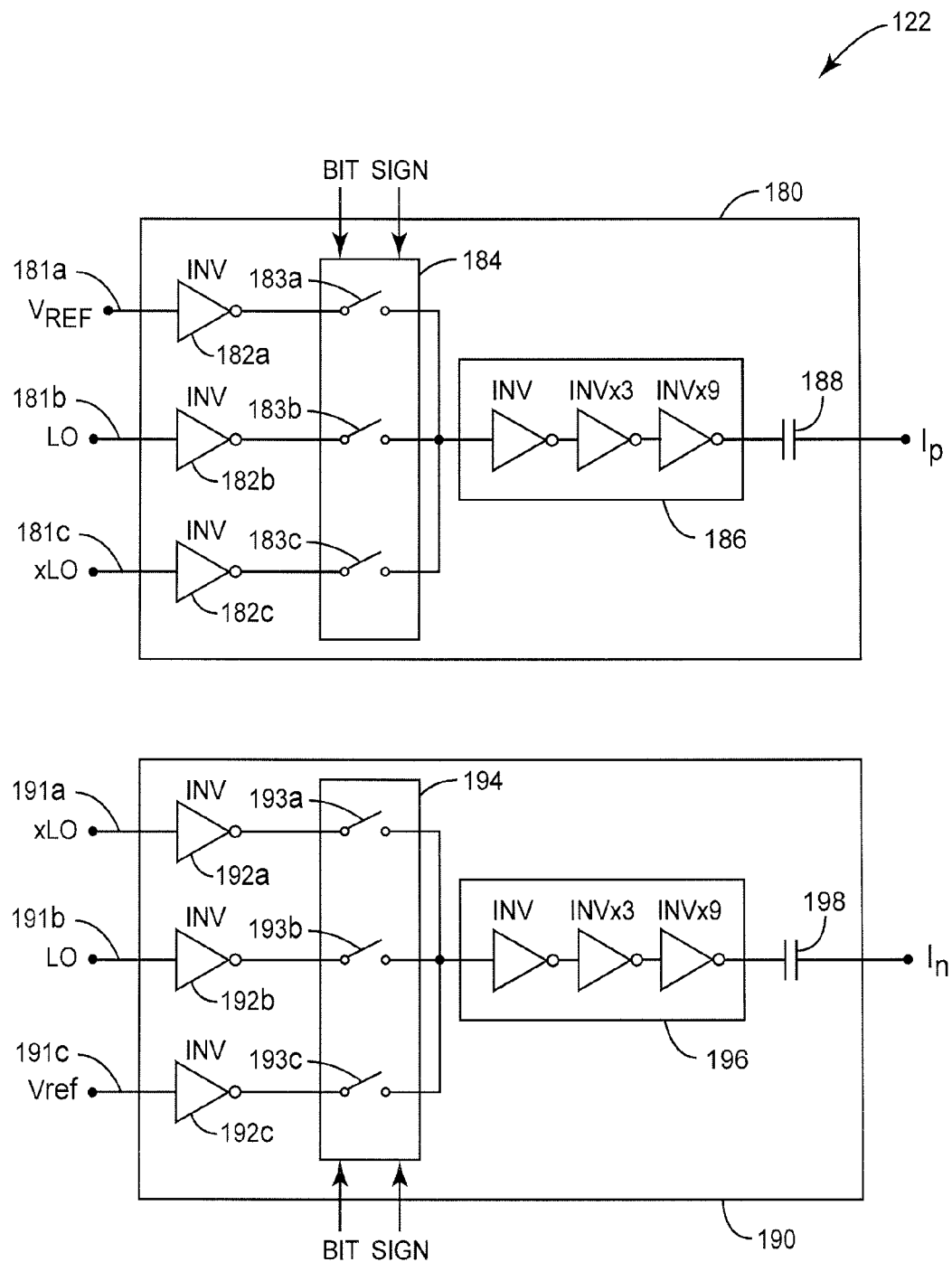
FIG. 4 depicts an exemplary conversion unit for the upconverter of FIG. 6.

FIG. 4 depicts one embodiment of a conversion unit 122. The circuit depicted in FIG. 4 corresponds to one of the conversion units 122 of FIG. 3. Therefore, when the input digital baseband value has N bits, N copies of the conversion unit 122 of FIG. 4 are used to implement the In-phase upconverter 120 and N copies are used to implement the Quadrature upconverter 130.

Conversion unit 122 comprises a first unit 180 and a separate second unit 190. The conversion unit 122 of FIG. 4 simultaneously uses LO and an inverted LO signal (xLO) in both branches to generate $I_p$ and $I_n$, each of which comprise a weighted average of the LO and xLO signals. More particularly, inputs 181a, 191c connect to a reference voltage $V_{REF}$, e.g., ground, inputs 181b, 191b connect to LO, and inputs 181c, 191a connect to xLO. The inputs 181a-181c are input to the first unit 180, where they are connected to respective inverters 182a-c, which invert the respective input signals 181a-c. The inputs 191a-191c are input to the second unit 190, where they are connected to respective inverters 192a-c, which invert the respective input signals 191a-c. The output of each inverter 182a-c, 192a-c connects to a respective switch unit 184, 194, which may, for example, comprise a transistor switch 183a-c, 193a-c for each inverter output.

Each switch unit 184, 194 in conversion unit 122 is controlled using the same data bit so that, for example, when the input data bit equals 0, switch units 184, 194 pass the inverted ground signals but do not pass the inverted LO/xLO signals. When the input data bit equals 1, switch units 184, 194 pass the inverted LO/xLO signals but do not pass the inverted ground signals. In this latter case, switches 183b, 183c, 193a, 193b are also controlled by the sign bit of the value. Table 3 shows one exemplary logic table applicable when the input data bit equals 1 when the set of inverters 186 and the set of inverters 196 invert by different amounts.

TABLE 3

|  | Sign Bit | |
| --- | --- | --- |
|  | 1 | 0 |
| Switch Unit 184 Output | Inverted xLO | Inverted LO |
| Switch Unit 194 Output | Inverted xLO | Inverted LO |

Table 4 shows another exemplary logic table applicable when the input data bit equals 1 when the sets of inverters 186, 196 provide the same amount of inversion.

TABLE 4

|  | Sign Bit | |
| --- | --- | --- |
|  | 1 | 0 |
| Switch Unit 184 Output | Inverted xLO | Inverted LO |
| Switch Unit 194 Output | Inverted LO | Inverted xLO |

The outputs of switch units 184, 194 respectively connect to the set of inverters 186, 196 connected in series, which buffer the signals output by the switch units 184, 194. The sets of inverters 186, 196 may comprise an odd or even number of inverters, and each set 186, 196 may comprise the same number or a different number of inverters. For example, when switch units 184, 194 output the inverted LO signal and the inverted xLO signal, respectively, set 186 and set 196 may each comprise the same number of inverters (and likewise correspond to Table 3). Alternatively, one set, e.g., set 196, may have an even number of more inverters than the other set, e.g., set 186, to generate more delay in the ground unit 190 while still maintaining the presence of LO and xLO in the output signals. This alternative embodiment also corresponds to Table 3. In another embodiment, e.g., when switch units 184, 194 both output the inverted LO signal or the inverted xLO signal, one set of inverters, e.g., set 196, may have an odd number of more inverters that the other set, e.g., set 186, which effectively implements an additional logic inversion in that set of inverters 196 relative to the other set of inverters 186 (corresponds to Table 2). This extra logic inversion facilitates, e.g., outputting xLO from the set of inverters 196 while simultaneously outputting LO from the other set of inverters 186, depending on the sign. Generating the weighted analog RF signal 125 in this manner, e.g., by using xLO and LO at the same time, enables the phase accuracy requirements for the LO and xLO signals to be relaxed.

The output of the each set of inverters 186, 196 connects to one plate of respective capacitors 188, 198. The other plates of the capacitors 188, 198 are decoupled to produce a differential embodiment with separate and isolated first and second outputs $I_p$ and $I_n$. In this embodiment, both branches 180, 190 are equal, because both are shut down the same way, e.g., both have an input connected to the same DC reference voltage (e.g., ground) to enable both to disconnect from the LO/xLO signals to shut down to the same reference voltage. In the embodiment of FIG. 4, both branches 180, 190 shut down to a reference voltage of ground. It will be appreciated, however, that any DC reference voltage may be used.

The embodiment of FIG. 4 uses the LO and xLO signals all the time, regardless of the sign. For example, when the bit does not shut down the branches 180, 190, the sign in combination with the number of inverters in the sets of inverters 186, 196 controls one of the first and second units 180, 190 to output the inverted version of the LO signal and controls the other of the first and second units 180, 190 to output the inverted version of the xLO signal. Thus, both branches 180, 190 in the conversion unit 122 of FIG. 4 use LO and xLO signals, depending on the phase/sign of the signal to be transmitted. As a result, the conversion unit 122 of FIG. 4 does not require propagation delay matching for LO and xLO signals. For example, if the phase of the LO signal is 0°, the phase of the xLO signal should be 180°. It will be appreciated that the differential implementation of FIG. 4 suppresses noise resulting from propagation delay matching, and therefore, relaxes the propagation delay requirements.

Figure 5:
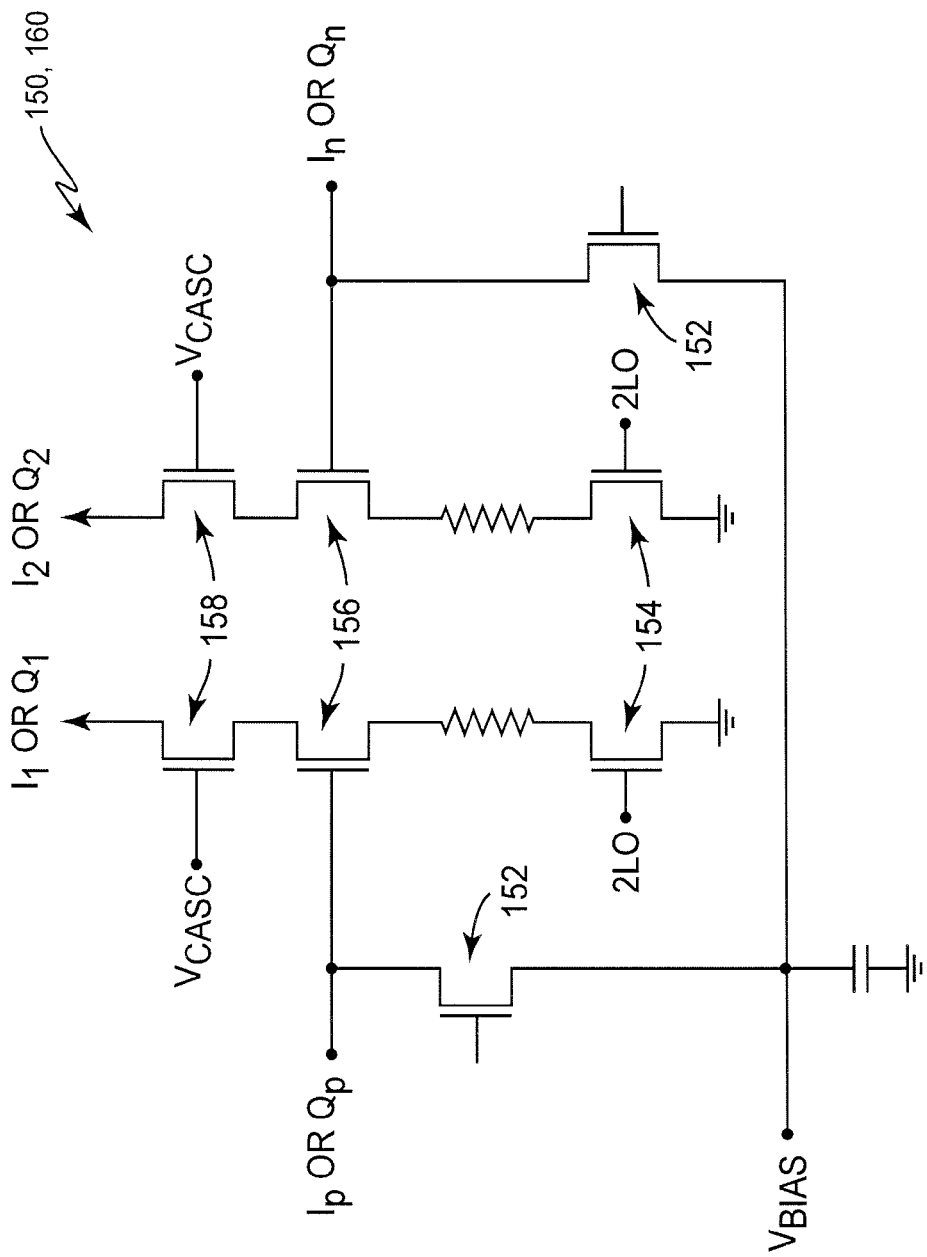
FIG. 5 depicts an exemplary amplifier for the digital-to-analog upconverter of FIG. 1.

FIG. 5 depicts one exemplary In-phase amplifier 150 comprising a differential common source amplifier. It will be appreciated that a similar amplifier circuit may be used for the Quadrature amplifier 160. When the amplifiers 150, 160 are enabled by out-of-phase signals at twice the RF (2LO) and the amplifier input signals are influenced by both the RF frequency and an inverted version of the RF frequency, e.g., LO and xLO, the amplifiers 150, 160 are alternately active. As a result, the amplifiers 150, 160, the amplifier input signals, the enable signals, the cascade voltages $V_{casc}$, and the bias voltage $V_{bias}$ work together to produce the amplifier outputs shown in Table 1. For example, $V_{bias}$ sets the bias point of In-phase amplifier 150 through the MOS switch transistors 152 operated in sync with incoming signals $I_p$ and $I_n$. Alternatively, it will be appreciated that the MOS switch transistors 152 may be replaced with a resistor to provide a constant DC path to the amplifier input. The 2LO signal drives transistors 154 to either be fully open or closed. $I_p$ and $I_n$ connect to the gates of the amplifying transistors 156, which convert the input voltage to output current. While not explicitly shown, additional resistors may be included at the source of transistors 156 to improve the linearity of the voltage-to-current conversion provided by transistors 156. Cascade transistors 158 isolate the amplifying transistors 156 from the output, which enables a higher amplifier power voltage associated with $PWR_2$ and helps make the voltage-to-current conversion more linear and more independent of the output voltage.

Figure 6A:
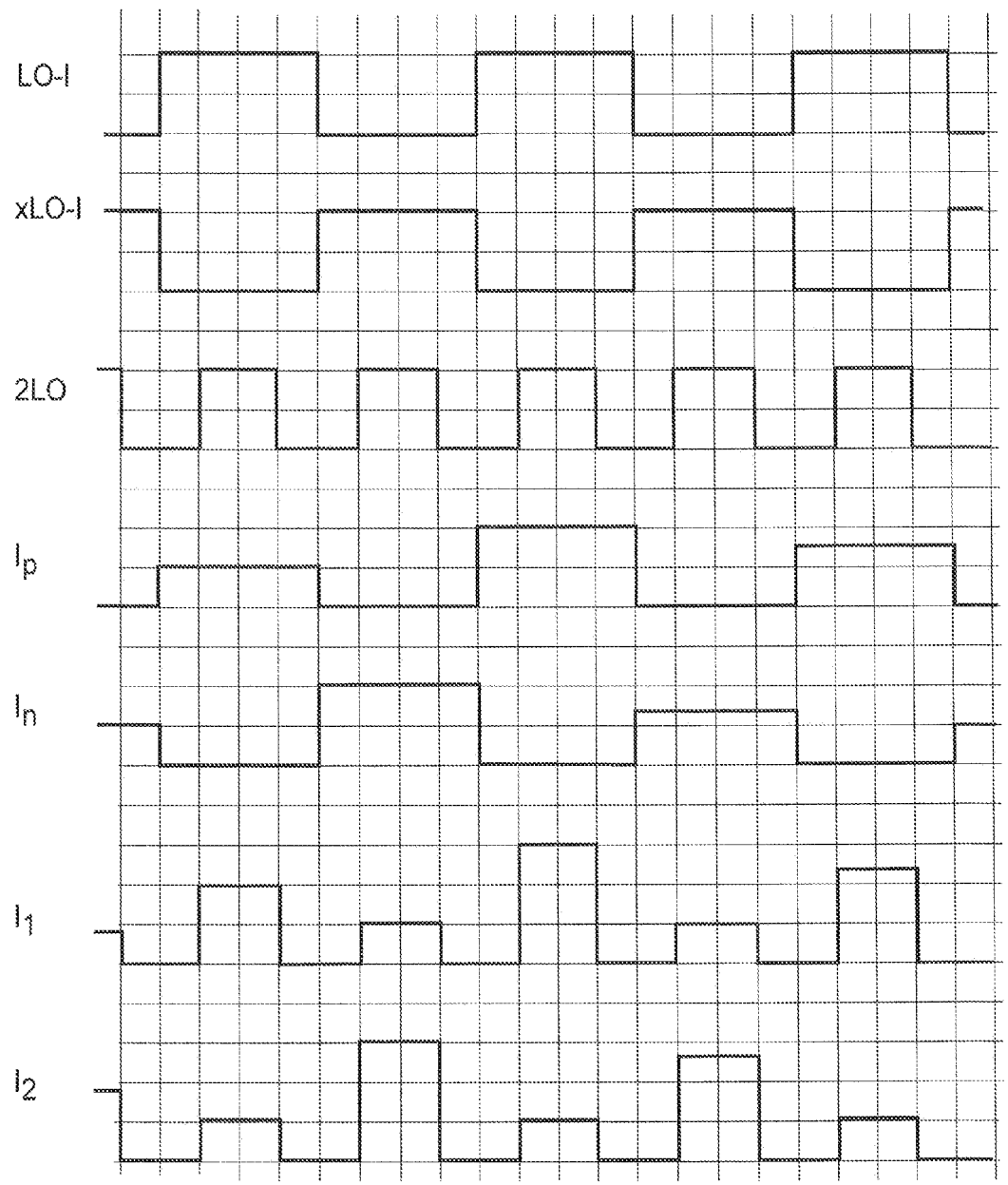
FIGS. 6A and 6B depict exemplary signals for the amplifier of FIG. 5.
Figure 6B:
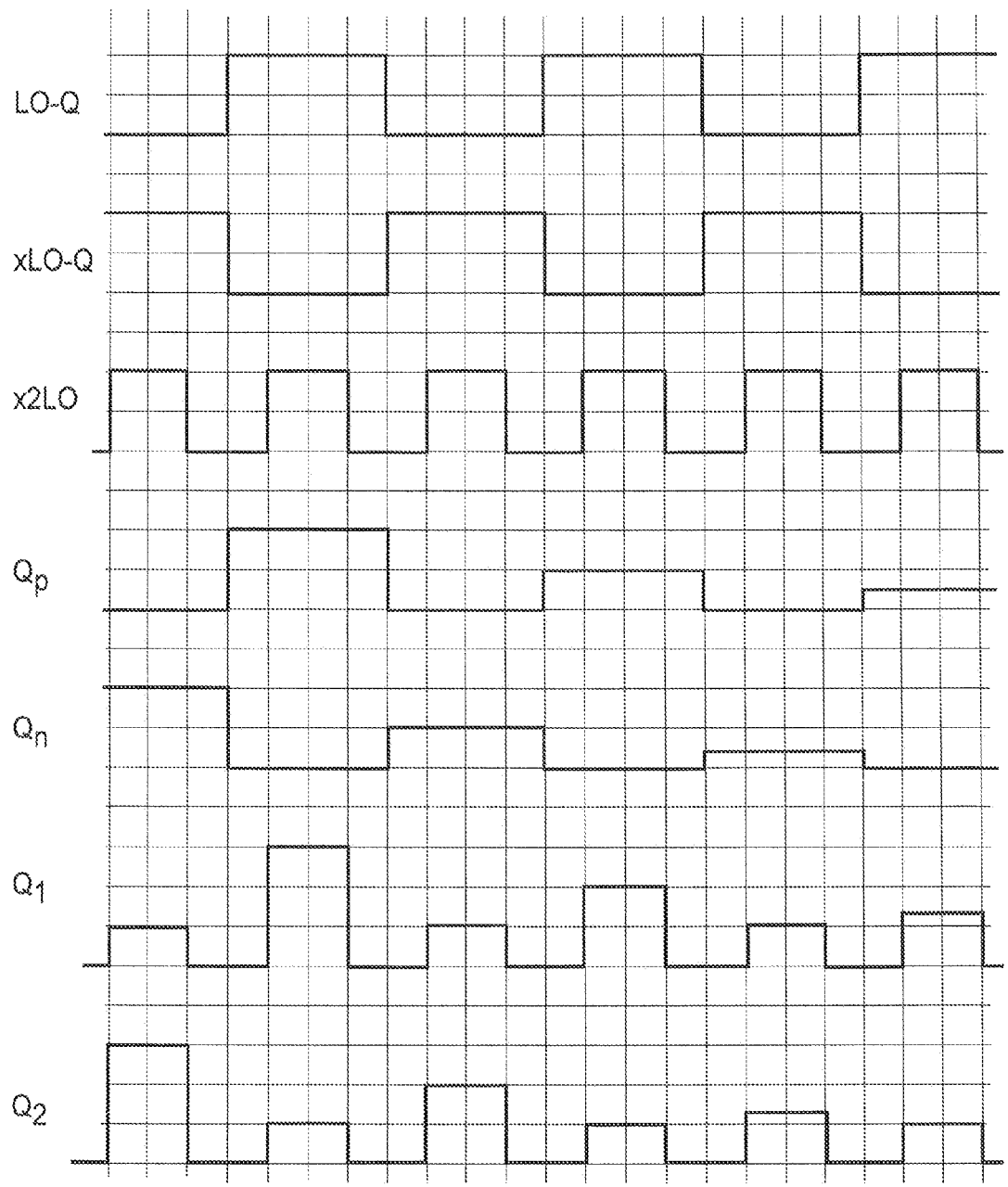

To further illustrate the operation of the amplifiers 150, 160, FIGS. 6A and 6B depict an exemplary signal diagram for the signals associated with the In-phase and Quadrature amplifiers 150, 160. FIG. 6A represents the In-phase signals, while FIG. 6B represents the Quadrature signals. The LO-I and LO-Q signals are the In-phase and Quadrature radio frequency signals, respectively. The xLO-I and xLO-Q signals are respectively the inverse of the LO-I and LO-Q signals. The 2LO and x2LO signals are the enable signals for the In-phase and Quadrature amplifiers, respectively. $I_p$ and $I_n$ represent the In-phase output voltages of the digital-to-analog converter showing LO-I as the base radio frequency, where the amplitude is modulated by the In-phase data, and where $I_p$ and $I_n$ are phase-shifted with respect to each other by 180°. $I_p$ and $I_n$ return to the same voltage, e.g., $V_{bias}$, when low; when high the amplitude reflects the In-phase data. Similarly, $Q_p$ and $Q_n$ represent the Quadrature output voltages of the digital-to-analog converter showing LO-Q as the base radio frequency, where $Q_p$ and $Q_n$ are phase-shifted by 180° and return to the same voltage, e.g., $V_{bias}$, when low and reflect the Quadrature data when high. It will be appreciated that $I_p$ and $I_n$ have different amplitudes than $Q_p$ and $Q_n$ because the Quadrature data differs from the In-phase data.

$I_1$ and $I_2$ represent the In-phase amplifier output signals, e.g., the first and second output signals. Mathematically speaking, $I_1$ and $I_2$ represent the product of $I_p$ and $I_n$ with 2LO. $I_1$ has a first value derived from the In-phase data, then zero, then $V_{bias}$, and then zero again. $I_2$ has a first value derived from $V_{bias}$, then zero, then the In-phase data, and then zero again. Similarly, $Q_1$ and $Q_2$ represent the In-phase amplifier output signals, e.g., the first and second output signals. Mathematically speaking, $Q_1$ and $Q_2$ represent the product of $Q_p$ and $Q_n$ with x2LO. $Q_1$ has a first value derived from zero, then the Quadrature data, then zero, then $V_{bias}$. $Q_2$ has a first value derived from zero, then $V_{bias}$, then zero, then the Quadrature data. Differential combiner 170 combines $I_1$ and $I_2$, e.g., by subtracting $I_2$ from $I_1$, in a first time period, and then combines $Q_1$ and $Q_2$, e.g., by subtracting $Q_2$ from $Q_1$, in a second time period, etc.

Figure 7:
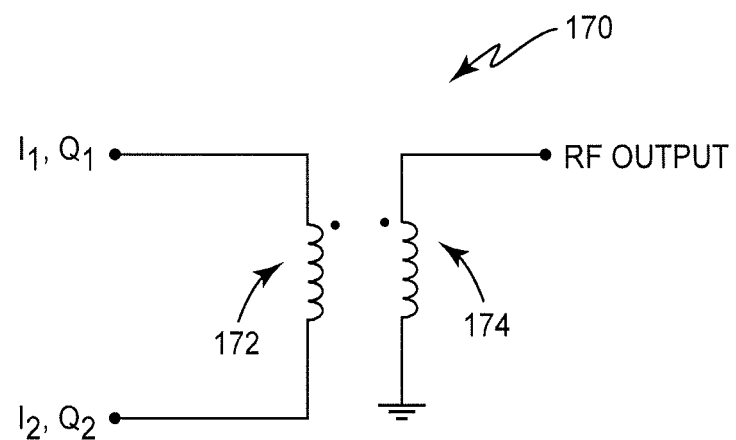
FIG. 7 depicts an exemplary differential combiner.

FIG. 7 depicts one exemplary differential combiner 170 comprising a double winding balun. A first end of the first winding 172 connects to the In-phase and Quadrature amplifiers 150, 160 so as to receive $I_1$ and $Q_1$, while a second end of the first winding 172 connects to the In-phase and Quadrature amplifiers 150, 160 so as to receive $I_2$ and $Q_2$. A first end of the second winding 174 provides the RF analog signal, which may for example be applied to an antenna, while a second end of the second winding 174 connects to ground.

Figure 8:
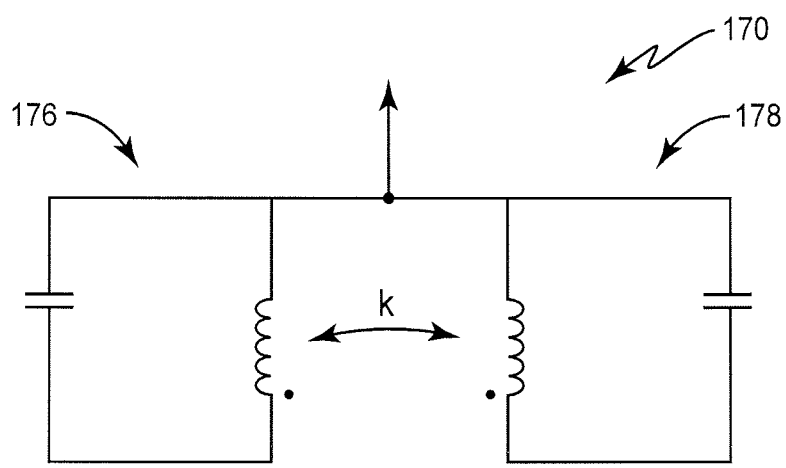
FIG. 8 depicts another exemplary differential combiner.

It will be appreciated that other differential combiners may be used in the digital-to-analog upconverter disclosed herein. For example, FIG. 8 shows an alternate differential combiner 170 comprising first and second LC resonators 176, 178 coupled by mutual inductance. When feeding differential current to the first and second LC resonators 176, 178, parallel resonance with inductors occurs, where the effective value equals the original inductance multiplied by 1+k. When feeding a common-mode signal, the inductance value is multiplied by 1−k, and the resonance frequency is at a different frequency, which results in a low impedance at the desired frequency. If mutual coupling between the inductances is good, the parameter k approaches 1, and the difference between the common-mode impedance and the differential-mode impedance increases.

Figure 9:
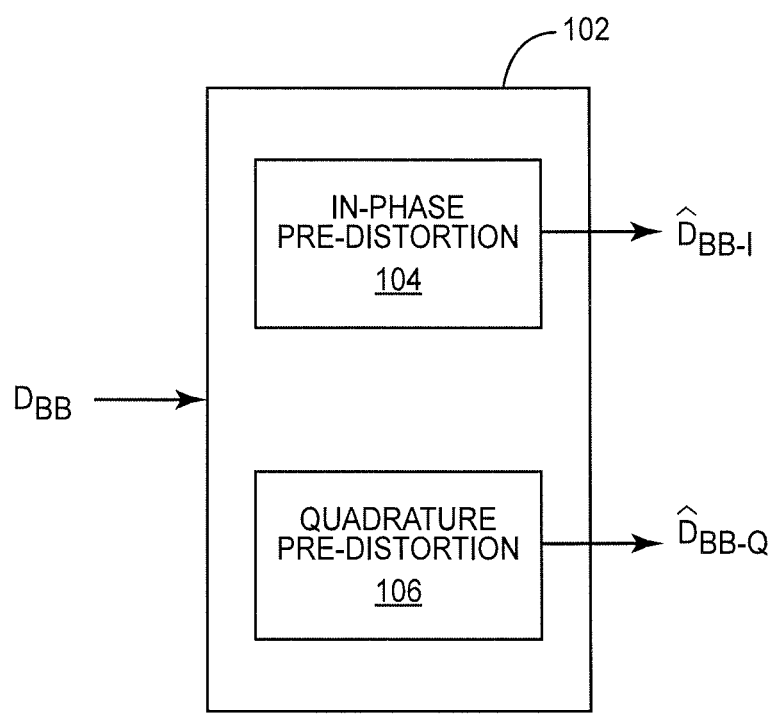
FIG. 9 depicts an optional pre-distortion module for the digital-to-analog upconverter.

As depicted in FIG. 1 and mentioned above, the upconversion module 110 may be powered by a first power supply ($PWR_1$), while the amplifier module 140 may be powered by a separate second power supply ($PWR_2$). The use of separate power supplies enables the upconversion module 110 and the amplifier module 140 to be driven differently, and possibly into different levels of compression, e.g., due to saturation. While compression effects may improve some performance parameters, e.g., noise performance, such compression effects generally degrade linearity. To compensate, digital-to-analog upconverter 100 may further include a pre-distortion module 102 disposed before the upconversion module 110. Based on an expected distortion, the pre-distortion module 102 generates a pre-distorted baseband value $\hat{D}_{BB}$ using any known means. It will be appreciated that the In-phase and Quadrature portions of the digital baseband value $D_{BB}$ may be compensated separately to produce a pre-distorted In-phase baseband value $\hat{D}_{BB-I}$ and/or a pre-distorted Quadrature baseband value $\hat{D}_{BB-Q}$, as shown in FIG. 9. In any event, $\hat{D}_{BB}$ instead of DBB is then used by the above-described procedures and applied to the above-described apparatuses.

By including the amplifiers 150, 160 between the upconversion module 110 and the differential combiner 170, embodiments disclosed herein enable increasing the output power of the digital-to-analog upconverter 100 without polluting power supplies, and therefore, without deteriorating the noise performance. The amplifiers 150 160 may also use a separate power supply ($PWR_2$) than the upconversion module 110 ($PWR_1$), which enables the digital-to-analog upconverter 100 to use higher supply voltages for a final stage of the upconversion module 110 than prior art solutions, while still increasing the output power capability. In particular, the separate power supplies enable the last inverter stage of the each upconversion unit 122 to be driven with a large signal, which pushes it into deep compression, and therefore, improves noise performance. The herein described pre-distortion unit 102 further enables the digital-to-analog upconverter 100 to meet the desired linearity performance regardless of the compression. Finally, the 25/75 duty cycle of the amplifier output signals provides very good power efficiency.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:
1. A digital-to-analog upconverter configured to convert a baseband digital value to a radio frequency (RF) analog signal, said digital-to-analog upconverter comprising:
 a first balanced upconverter configured to convert an In-phase portion of the baseband digital value to a first In-phase analog component ($I_p$) at a radio frequency and a second In-phase analog component ($I_n$) at the radio frequency, where $I_n$ is phase-shifted relative to $I_p$;

a second balanced upconverter configured to convert a Quadrature portion of the baseband digital value to a first Quadrature analog component ($Q_p$) at the radio frequency and a second Quadrature analog component ($Q_n$) at the radio frequency, where $Q_p$ is phase-shifted relative to $Q_n$;

a first amplifier configured to amplify $I_p$ and $I_n$ to generate amplified $I_p$ and $I_n$ signals at first and second In-phase amplifier outputs;

a second amplifier configured to amplify $Q_p$ and $Q_n$ to generate amplified $Q_p$ and $Q_n$ signals at first and second Quadrature amplifier outputs;

wherein the first and second amplifiers each operate at a 50% duty cycle and in an interleaved fashion such that only one of the first and second amplifiers is active at any time, and such that the first amplifier outputs the amplified $I_p$ and amplified $I_n$ signals for a first 25% of a cycle, the second amplifier outputs the amplified $Q_p$ and amplified $Q_n$ signals for a subsequent second 25% of the cycle, the first amplifier outputs the amplified $I_p$ and amplified $I_n$ signals for a subsequent third 25% of the cycle, and the second amplifier outputs the amplified $Q_p$ and amplified $Q_n$ signals for a final 25% of the cycle; and a differential combiner configured to combine the amplified signals output by the first and second amplifiers during the cycle to generate the RF analog signal representative of the baseband digital value.

2. The digital-to-analog upconverter of claim 1 wherein the first and second balanced upconverters receive power from a first power supply, and wherein the first and second amplifiers receive power from a separate second power supply.

3. The digital-to-analog upconverter of claim 1 wherein the differential combiner comprises a balun having first and second windings, wherein the first In-phase and Quadrature amplifier outputs couple to a first end of the first winding, the second In-phase and Quadrature amplifier outputs couple to a second end of the first winding, a first end of the second winding couples to ground, and a second end of the second winding couples to a digital-to-analog upconverter output to output the RF analog signal.

4. The digital-to-analog upconverter of claim 1 wherein the differential combiner comprises a differential inductor having first and second inductor-capacitor resonators connected in parallel, wherein the first In-phase and Quadrature amplifier outputs couple to a first end of the first inductor-capacitor resonator, the second In-phase and Quadrature amplifier outputs couple to a first end of the second inductor-capacitor resonator, and wherein the first end of the first inductor-capacitor resonator is configured to output a positive portion of the RF analog signal and the first end of the second inductor-capacitor resonator is configured to output a negative portion of the RF analog signal.

5. The digital-to-analog upconverter of claim 1 wherein the first and second amplifiers comprise common source amplifiers.

6. The digital-to-analog upconverter of claim 1 further comprising a pre-compensation unit operatively connected to an input of each of the first and second balanced upconverters and configured to pre-distort the In-phase and Quadrature portions of the baseband digital value based on an expected distortion incurred during the digital-to-analog upconversion and based on a desired linearity requirement for the RF analog signal to generate a pre-distorted In-phase portion of the baseband digital value and a pre-distorted Quadrature portion of the baseband digital value, wherein the first balanced upconverter is configured to convert the pre-distorted In-phase portion of the digital value and wherein the second balanced upconverter is configured to convert the pre-distorted Quadrature portion of the digital value.

7. The digital-to-analog upconverter of claim 1 further comprising an oscillator unit configured to output one or more local oscillator signals at the radio frequency for application to the first and second upconverters, wherein the one or more local oscillator signals applied to the second upconverter are out-of-phase with the one or more local oscillator signals applied to the first upconverter.

8. The digital-to-analog upconverter of claim 7 wherein the oscillator unit is further configured to output a first and second amplifier enable signal at twice the radio frequency, and wherein the first and second amplifier enable signals are respectively applied to the first and second amplifiers to implement the interleaved output operations.

9. The digital-to-analog upconverter of claim 7 wherein the first balanced upconverter comprises:

a plurality of In-phase conversion units, one for each digital signal of the In-phase portion of the baseband digital value, each In-phase conversion unit comprising:

a first I-branch configured to output a first weighted I-signal responsive to a first reference signal, the one or more oscillator signals, the corresponding input digital signal, and a sign of the baseband digital value;

a second I-branch configured to output a second weighted I-signal responsive to a second reference signal, the one or more oscillator signals, the corresponding input digital signal, and the sign of the baseband digital value;

a first In-phase combining node to combine the first weighted I-signals to generate $I_p$; and a second In-phase combining node to combine the second weighted I-signals to generate $I_n$; and wherein the second balanced upconverter comprises:

a plurality of Quadrature conversion units, one for each digital signal of the Quadrature portion of the baseband digital value, each Quadrature conversion unit comprising:

a first Q-branch configured to output a first weighted Q-signal responsive to the first reference signal, the one or more out-of-phase oscillator signals, the corresponding input digital signal, and a sign of the baseband digital value;

a second Q-branch configured to output a second weighted Q-signal responsive to the second reference signal, the one or more out-of-phase oscillator signals, the corresponding input digital signal, and the sign of the baseband digital value;

a first Quadrature combining node to combine the first weighted Q-signals to generate $Q_p$; and a second Quadrature combining node to combine the second weighted Q-signals to generate $Q_n$.

10. The digital-to-analog upconverter of claim 9 wherein the oscillator unit outputs a first local oscillator signal and an inverted version of the first local oscillator signal, and wherein $I_n$, $I_p$, $Q_p$, and $Q_n$ each comprise a weighted average of the first local oscillator signal and the inverted version of the first local oscillator signal.

11. The digital-to-analog upconverter of claim 9 wherein the baseband digital value represents a binary number having a plurality of bits, where each bit of the binary number has a relative binary weight corresponding to the bit position within the binary number, and wherein a weighting factor of each conversion unit corresponds to the relative binary weight of the corresponding input bit.

12. A method of converting a baseband digital value to a radio frequency (RF) analog signal comprising:
- converting an In-phase portion of the baseband digital value to a first In-phase analog component ($I_p$) at a radio frequency and a second In-phase analog component ($I_n$) at the radio frequency, where $I_n$ is phase-shifted relative to $I_p$;
- converting a Quadrature portion of the baseband digital value to a first Quadrature analog component ($Q_p$) at the radio frequency and a second Quadrature analog component ($Q_n$) at the radio frequency, where $Q_n$ is phase-shifted relative to $Q_p$;
- amplifying $I_p$ and $I_n$ using a first amplifier to generate amplified $I_p$ and $I_n$ signals at first and second In-phase amplifier outputs;
- amplifying $Q_p$ and $Q_n$ using a second amplifier to generate amplified $Q_p$ and $Q_n$ signals at first and second Quadrature amplifier outputs;
- wherein amplifiers used to amplify the $I_p$, $I_n$, $Q_p$, and $Q_n$ signals operate at a 50% duty cycle and in an interleaved fashion such that only one of the first and second amplifiers is active at any time, and such the first amplifier outputs the amplified $I_p$ and amplified $I_n$ signals for a first 25% of the cycle, the second amplifier outputs the amplified $Q_p$ and amplified $Q_n$ signals for a subsequent second 25% of the cycle, the first amplifier outputs the amplified $I_p$ and amplified $I_n$ signals for a subsequent third 25% of the cycle, and the second amplifier outputs the amplified $Q_p$ and amplified $Q_n$ signals for a final 25% of the cycle; and
- combining the amplified signals output during the cycle to generate the RF analog signal representative of the baseband digital value.

13. The method of claim 12 further comprising powering the conversion operations with a first power supply, and powering the amplification operations with a separate second power supply.

14. The method of claim 12 wherein combining the amplified signals comprises combining the amplified signals using a balun comprising first and second windings by:
- coupling the first In-phase and Quadrature amplifier outputs to a first end of the first winding;
- coupling the second In-phase and Quadrature amplifier outputs to a second end of the first winding;
- coupling a first end of the second winding to ground; and
- coupling a second end of the second winding to a digital-to-analog upconverter output to output the RF analog signal.

15. The method of claim 12 further comprising pre-distorting the In-phase and Quadrature portions of the baseband digital value based on an expected distortion incurred during digital-to-analog upconversion and based on a desired linearity requirement for the RF analog signal to generate a pre-distorted In-phase portion of the baseband digital value and a pre-distorted Quadrature portion of the baseband digital value, wherein converting the In-phase and Quadrature portions of the baseband digital value comprises converting the pre-distorted In-phase and Quadrature portions of the digital value.

16. The method of claim 12 further comprising generating an amplifier enable signal at twice the radio frequency, and enabling the first and second amplifiers using the amplifier enable signal to implement the interleaved amplifier operations.

17. The method of claim 12 further comprising generating one or more local oscillator signals at the radio frequency, wherein converting the In-phase and Quadrature portions of the baseband digital value comprises converting the In-phase portion of the baseband digital value based on the one or more local oscillator signals and converting the Quadrature portion of the baseband digital value based on an out-of-phase version of the one or more local oscillator signals.

18. The method of claim 17 wherein converting the In-phase portion of the digital baseband value comprises:
- for each of a plurality of digital signals of the In-phase portion of the baseband digital value, generating a first weighted I-signal responsive to a first reference signal, the one or more oscillator signals, the corresponding input digital signal, and a sign of the baseband digital value, and generating a second weighted I-signal responsive to a second reference signal, the one or more oscillator signals, the corresponding input digital signal, and the sign of the baseband digital value;
- combining the first weighted I-signals to generate $I_p$;
- combining the second weighted I-signals to generate $I_n$;
- for each of a plurality of digital signals of the Quadrature portion of the baseband digital value, generating a first weighted Q-signal responsive to the first reference signal, the one or more out-of-phase oscillator signals, the corresponding input digital signal, and a sign of the baseband digital value, and generating a second weighted Q-signal responsive to the second reference signal, the one or more out-of-phase oscillator signals, the corresponding input digital signal, and the sign of the baseband digital value;
- combining the first weighted Q-signals to generate $Q_p$; and
- combining the second weighted Q-signals to generate $Q_n$.

19. The method of claim 18 wherein generating one or more local oscillator signals comprises generating a first local oscillator signal and an inverted version of the first local oscillator signal, and wherein $I_n$, $I_p$, $Q_p$, and $Q_n$ each comprise a weighted average of the first local oscillator signal and the inverted version of the first local oscillator signal.

20. The method of claim 18 wherein the baseband digital value represents a binary number having a plurality of bits, and each bit of the binary number has a relative binary weight corresponding to the bit position within the binary number, and wherein each weighted I-signal and weighted Q-signal is weighted according to a weighting factor corresponding to the relative binary weight of the corresponding input bit.

* * * * *

UNITED STATES PATENT AND TRADEMARK OFFICE
CERTIFICATE OF CORRECTION

| | | |
|---|---|---|
| PATENT NO. | : 8,542,769 B2 | Page 1 of 1 |
| APPLICATION NO. | : 13/156751 | |
| DATED | : September 24, 2013 | |
| INVENTOR(S) | : Vilhonen | |

It is certified that error appears in the above-identified patent and that said Letters Patent is hereby corrected as shown below:

In The Specification

In Column 3, Line 61, delete "$I_p$ and" and insert -- $I_p$ and $I_n$ --, therefor.

In Column 8, Line 32, delete "DBB" and insert -- $D_{BB}$ --, therefor.

Signed and Sealed this
Tenth Day of May, 2016

Michelle K. Lee
*Director of the United States Patent and Trademark Office*